US012635549B2

(12) United States Patent
Tanaka

(10) Patent No.: US 12,635,549 B2
(45) Date of Patent: May 19, 2026

(54) BUMP-FORMING DEVICE, BUMP-FORMING METHOD, AND NON-TRANSITORY COMPUTER-READABLE MEDIUM

(71) Applicant: Yamaha Robotics Co., Ltd., Tokyo (JP)

(72) Inventor: Kiyotaka Tanaka, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 363 days.

(21) Appl. No.: 18/037,760

(22) PCT Filed: Jun. 22, 2021

(86) PCT No.: PCT/JP2021/023669
§ 371 (c)(1),
(2) Date: May 18, 2023

(87) PCT Pub. No.: WO2022/269772
PCT Pub. Date: Dec. 29, 2022

(65) Prior Publication Data
US 2024/0055388 A1     Feb. 15, 2024

(51) Int. Cl.
*H01L 23/00* (2006.01)

(52) U.S. Cl.
CPC ............. *H01L 24/78* (2013.01); *H01L 24/85* (2013.01); *H01L 2224/78901* (2013.01); *H01L 2224/85047* (2013.01); *H01L 2224/85051* (2013.01)

(58) Field of Classification Search
CPC ................. H01L 24/78; H01L 2224/78; H01L 2224/78901; H01L 2224/78301; H01L 24/85; H01L 24/48

USPC .......................................................... 438/612
See application file for complete search history.

(56) References Cited

U.S. PATENT DOCUMENTS

| | | | | |
|---|---|---|---|---|
| 5,421,503 A | * | 6/1995 | Perlberg | H01L 24/85 |
| | | | | 228/180.5 |
| 5,884,830 A | * | 3/1999 | Yamazaki | B23K 20/007 |
| | | | | 228/1.1 |
| 7,153,764 B2 | | 12/2006 | Iwata et al. | |
| 7,229,906 B2 | | 6/2007 | Babinetz et al. | |
| 7,510,958 B2 | | 3/2009 | Iwata et al. | |
| 7,651,022 B2 | | 1/2010 | Babinetz et al. | |

(Continued)

FOREIGN PATENT DOCUMENTS

| | | |
|---|---|---|
| JP | H0645413 | 2/1994 |
| JP | H08153745 | 6/1996 |

(Continued)

OTHER PUBLICATIONS

"Office Action of Korea Counterpart Application", issued on Aug. 1, 2024, with English translation thereof, p. 1-p. 22.

(Continued)

*Primary Examiner* — Didarul A Mazumder
(74) *Attorney, Agent, or Firm* — JCIPRNET

(57) ABSTRACT

A bump-forming device includes a bonding tool and a bonding controller. The bonding controller is configured to execute a crimping step, a delivery step, a pressing step, and a cutting step, and of the trajectories of the bonding tool, at least the trajectory in the delivery step is determined on the basis of a first parameter relating to a wire (w) and a second parameter relating to the shape of the bonding tool.

9 Claims, 12 Drawing Sheets

(56) References Cited

U.S. PATENT DOCUMENTS

| | | | |
|---|---|---|---|
| 7,748,599 | B2 | 7/2010 | Arahata et al. |
| 8,042,725 | B2 | 10/2011 | Arahata et al. |
| 2004/0152292 | A1 | 8/2004 | Babinetz et al. |
| 2008/0054052 | A1* | 3/2008 | Arakawa ................. H01L 24/48 228/244 |
| 2010/0059574 | A1* | 3/2010 | Arahata .................. H01L 24/48 228/110.1 |
| 2018/0326531 | A1* | 11/2018 | Komagino .............. H01L 24/85 |

FOREIGN PATENT DOCUMENTS

| | | |
|---|---|---|
| JP | 2725116 | 3/1998 |
| JP | 2004282015 | 10/2004 |
| JP | 2005116603 | 4/2005 |
| JP | 2005175175 | 6/2005 |
| JP | 2008066331 | 3/2008 |
| JP | 2009054950 | 3/2009 |
| KR | 20100030573 | 3/2010 |
| SG | 144694 | 8/2008 |
| SG | 166004 | 11/2010 |

OTHER PUBLICATIONS

"International Search Report (Form PCT/ISA/210) of PCT/JP2021/023669", mailed on Sep. 7, 2021, with English translation thereof, pp. 1-6.
"Office Action of Taiwan Counterpart Application", issued on May 23, 2023, with partial English translation thereof, pp. 1-13.

* cited by examiner

BUMP-FORMING DEVICE, BUMP-FORMING METHOD, AND NON-TRANSITORY COMPUTER-READABLE MEDIUM

CROSS-REFERENCE TO RELATED APPLICATION

This application is a 371 application of the International PCT application serial no. PCT/JP2021/023669, filed on Jun. 22, 2021. The entirety of the above-mentioned patent application is hereby incorporated by reference herein and made a part of this specification.

TECHNICAL FIELD

The present invention relates to a bump-forming device, a bump-forming method and a bump-forming program.

RELATED ART

In order to obtain a target bonding shape using a wire bonding apparatus, many parameters need to be set, and studies are underway to simplify setting of these parameters.

For example, Patent Document 1 discloses a wire bonding apparatus provided with an arithmetic means. The arithmetic means receives bonding shape data on at least crimp diameter and crimp thickness input by a keyboard, and generates a control signal relating to ultrasonic power applied to a tip of a bonding tool and ultrasonic application time during bonding, and a control signal relating to a pressurizing force of the bonding tool on a bonding point.

Patent Document 2 discloses a wire bonding apparatus provided with an arithmetic means. The arithmetic means receives data on a bonding tool in addition to bonding shape data, and generates a control signal relating to ultrasonic power and ultrasonic application time and a control signal relating to a pressurizing force.

PRIOR-ART DOCUMENTS

Patent Documents

Patent Document 1: Japanese Patent No. 2725116
Patent Document 2: Japanese Patent Laid-open No. H6-45413

SUMMARY OF THE INVENTION

Problems to be Solved by the Invention

A bump-forming device using wire bonding technology is known as a device forming a bump on a bond point of a semiconductor device or the like. In order to obtain a target bump shape using such a bump-forming device, many parameters including those relating to a trajectory of a bonding tool from where a wire is crimped to where the wire is cut need to be set. However, since there is no description of bump formation in Patent Document 1 and Patent Document 2, even if the description of Patent Document 1 and Patent Document 2 is applied to the bump-forming device, there are cases where parameter setting cannot be sufficiently simplified.

The present invention has been made in view of such circumstances, and an object of the present invention is to provide a bump-forming device, a bump-forming method, and a bump-forming program in which parameter setting is simplified.

Means for Solving the Problems

A bump-forming device according to one aspect of the present invention includes: a bonding tool, bonding a wire to a bond point as a bonding target; and a bonding controller, controlling the bonding tool to form a bump on the bond point. The bonding controller is configured to execute: a crimping step in which a ball part formed at a tip of the wire extending from a tip of the bonding tool is crimped to the bond point by the tip of the bonding tool; a delivery step in which the bonding tool is moved while the wire is delivered from the ball part crimped to the bond point; a pressing step in which a portion of the ball part crimped to the bond point is pressed by the tip of the bonding tool, and the ball part crimped to the bond point is deformed; and a cutting step in which the wire is cut and the bump is formed on the bond point. Based on a first parameter relating to the wire and a second parameter relating to shape of the bonding tool, at least a trajectory in the delivery step in the trajectory of the bonding tool is determined.

According to this aspect, trial production work and measurement work for setting a wide variety of parameters, which are not easy even for a skilled worker, can be simplified, and a bump of a desired shape can be obtained by setting the first parameter and the second parameter.

In the above aspect, the bonding controller may acquire the first parameter and the second parameter input by an input device, and calculate the trajectory of the bonding tool.

In the above aspect, the first parameter may include a diameter of the ball part before being crimped and a diameter and a thickness of a crimp lower portion of the ball part crimped to the bond point, the crimp lower portion being formed between the bonding tool and the bond point. The second parameter may include a hole diameter of a hole of the bonding tool through which the wire is inserted, and a chamfer diameter and a chamfer angle of a chamfer provided on a tip side of the hole of the bonding tool. The bonding controller may calculate a volume of a crimp upper portion of the ball part crimped to the bond point, the crimp upper portion being formed inside the bonding tool.

In the above aspect, the trajectory of the bonding tool may include an ascending path away from the bond point. The bonding controller may calculate a distance of the ascending path based on the volume of the crimp upper portion.

In the above aspect, the trajectory of the bonding tool may further include a slide path moving in a direction intersecting the ascending path. The first parameter may include a diameter and a material of the wire. The bonding controller may calculate a distance of the slide path based on the chamfer diameter and the diameter and the material of the wire.

In the above aspect, the trajectory of the bonding tool may further include a descending path approaching the bond point. The bonding controller may calculate a distance of the descending path based on the distance of the ascending path and the material of the wire.

A bump-forming method according to another aspect of the present invention includes the following. In a crimping step, a ball part formed at a tip of a wire extending from a tip of a bonding tool is crimped to a bond point by the tip of the bonding tool. In a delivery step, the bonding tool is moved while the wire is delivered from the ball part crimped to the bond point. In a pressing step, a portion of the ball part crimped to the bond point is pressed by the tip of the bonding tool, and the ball part crimped to the bond point is deformed. In a cutting step, the wire is cut and a bump is formed on the bond point. Based on a first parameter relating to the wire and a second parameter relating to shape of the bonding tool, at least a trajectory in the delivery step in the trajectory of the bonding tool is determined.

In the above aspect, between a first bond point and a second bond point electrically connected by wire bonding, the bump may be formed at the first bond point. The bump may have a greater thickness on a side close to the second bond point than on a side far from the second bond point.

A bump-forming program according to another aspect of the present invention causes a computer to execute: crimping processing in which a ball part formed at a tip of a wire extending from a tip of a bonding tool is crimped to a bond point by the tip of the bonding tool; delivery processing in which the bonding tool is moved while the wire is delivered from the ball part crimped to the bond point; pressing processing in which a portion of the ball part crimped to the bond point is pressed by the tip of the bonding tool, and the ball part crimped to the bond point is deformed; and cutting processing in which the wire is cut and a bump is formed on the bond point. Based on a first parameter relating to the wire and a second parameter relating to shape of the bonding tool, at least a trajectory in the delivery processing in the trajectory of the bonding tool is determined.

In the above aspect, the bump-forming program may be recorded on a computer-readable recording medium.

Effects of the Invention

According to the present invention, a bump-forming device, a bump-forming method, and a bump-forming program can be provided in which parameter setting is simplified.

DESCRIPTION OF THE EMBODIMENTS

An embodiment of the present invention is hereinafter described with reference to the drawings. The drawings of the present embodiment are illustrative, and the dimensions or shapes of each part are schematic. The technical scope of the present invention should not be construed as being limited to the embodiment.

Figure 1:
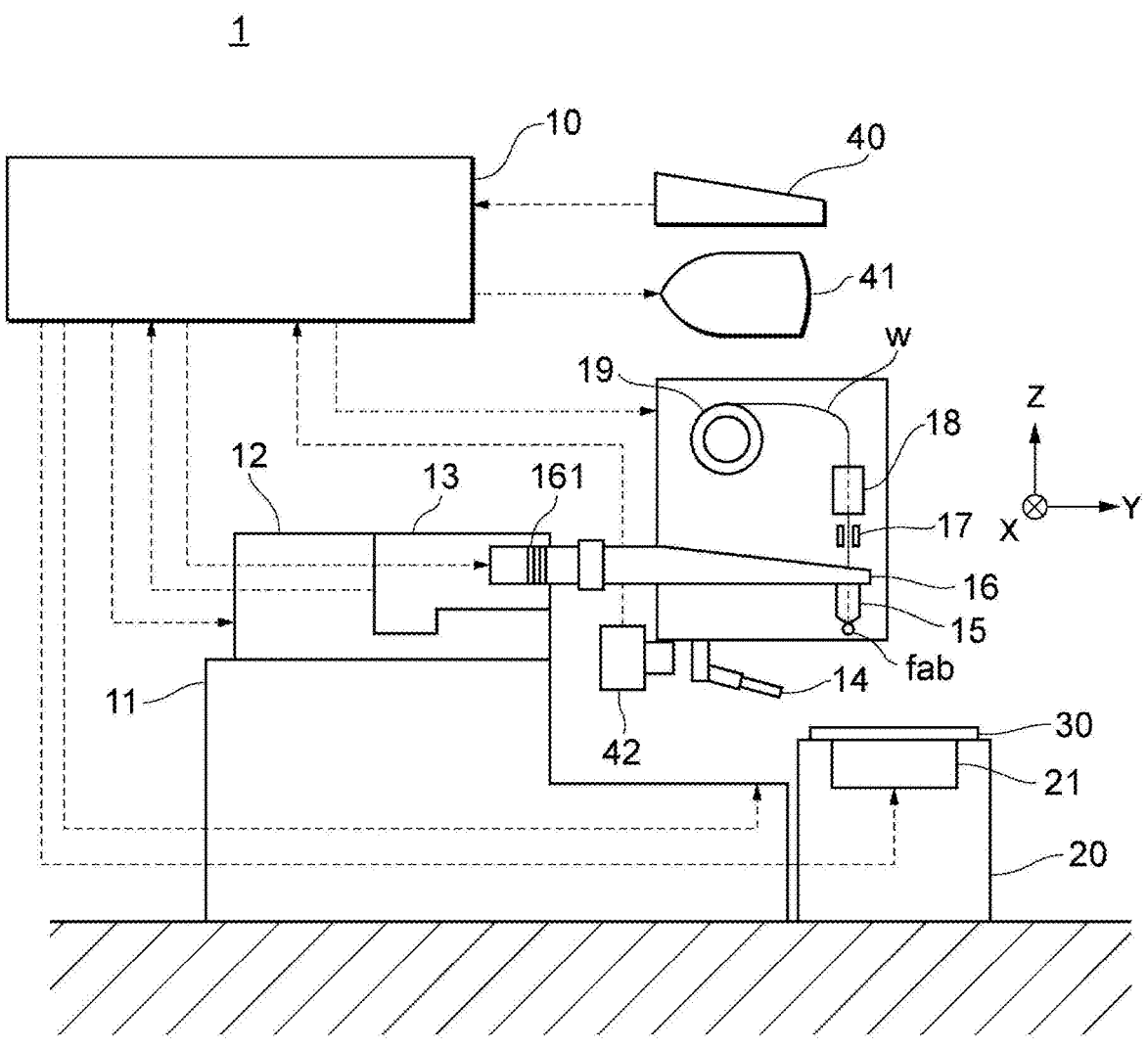
FIG. 1 schematically illustrates a configuration of a bump-forming device according to one embodiment.

A configuration of a bump-forming device 1 according to one embodiment of the present invention is described with reference to FIG. 1. FIG. 1 schematically illustrates a configuration of a bump-forming device according to one embodiment. The bump-forming device 1 is, for example, a bonding apparatus used in the technical field of wire bonding.

As illustrated in FIG. 1, the bump-forming device 1 according to the present embodiment is configured to include a bonding controller 10, a base 11, an XY table 12, a bonding head 13, a torch electrode 14, a capillary 15, an ultrasonic horn 16, a wire clamper 17, a wire tensioner 18, a rotary spool 19, a bonding stage 20, a heater 21, an operation part 40, a display 41, a camera 42 and the like.

In the following embodiment, a plane parallel to a semiconductor device (for example, a semiconductor die or a chip size package) or a substrate or a lead frame as a bonding target is taken as an XY plane, and a direction perpendicular to the XY plane is taken as a Z direction. A tip position of the capillary 15 is specified by spatial coordinates (X, Y, Z) represented by an X coordinate, a Y coordinate, and a Z coordinate.

The base 11 is configured to slidably carry the XY table 12. The XY table 12 is a moving device able to move the capillary 15 to a predetermined position on the XY plane based on a drive signal from the bonding controller 10.

The bonding head 13 is a moving device integrally formed with a bonding arm (not illustrated) and movably holding the ultrasonic horn 16 in the Z direction based on the drive signal from the bonding controller 10. The bonding head 13 has a lightweight low center-of-gravity structure and is configured to be able to suppress movement of the capillary 15 due to inertial force generated as the XY table 12 moves.

The ultrasonic horn 16 is a rod-shaped member including, from end to tip, an end, a flange, a horn portion, and a tip. An ultrasonic oscillator 161 that vibrates in response to the drive signal from the bonding controller 10 is arranged at the end. The flange is attached to the bonding head 13 via the bonding arm so as to be able to resonate at a position serving as a node of ultrasonic vibration. The horn portion is an arm extending longer than a diameter of the end, and has a structure that amplifies the amplitude of vibration caused by the ultrasonic oscillator 161 and transmits the vibration to the tip. The tip serves as an attachment part that replaceably holds the capillary 15. The ultrasonic horn 16 has a resonance structure that resonates with the vibration of the ultrasonic oscillator 161 as a whole, and is configured into a structure in which the ultrasonic oscillator 161 and the flange are located at a vibration node and the capillary 15 is located at a vibration antinode at the time of resonance. By these configurations, the ultrasonic horn 16 functions as a transducer that converts an electrical drive signal into mechanical vibration.

The capillary 15 is a portion bonding a wire w to a bond point as a bonding target, and corresponds to an example of a "bonding tool" in the present invention. The capillary 15 is provided with an insertion hole through which the wire w used for bonding can be inserted and delivered. The capillary 15 is replaceably attached to the ultrasonic horn 16 by spring force or the like.

The wire clamper 17 includes a piezoelectric element that opens and closes based on a control signal of the bonding controller 10, and is configured so that the wire w can be gripped or released at a predetermined timing.

The wire tensioner 18 has the wire w inserted therethrough, and is configured to be able to apply appropriate tension to the wire w during bonding by freely changing the tension on the wire w based on the control signal of the bonding controller 10.

The rotary spool 19 replaceably holds a reel around which the wire w is wound, and is configured to deliver the wire w according to the tension exerted through the wire tensioner 18. A material of the wire w is selected on account of ease of processing and low electrical resistance. Gold (Au), silver (Ag), aluminum (Al), copper (Cu) or the like is usually used.

The torch electrode 14 is connected to a high voltage power supply (not illustrated) via a discharge stabilizing resistor (not illustrated), and is configured to generate a spark (discharge) based on the control signal from the bonding controller 10, and be able to form a free air ball fab (corresponding to an example of a "ball part" of the present invention) at a tip of the wire w delivered from the tip of the capillary 15 by heat of the spark. The position of the torch electrode 14 is fixed. During discharge, the capillary 15 may approach to a position at a predetermined distance from the torch electrode 14, and an appropriate spark may be generated between the tip of the wire w and the torch electrode 14.

The bonding stage 20 is a stage having a workpiece 30 (such as a substrate or a semiconductor die) for forming a bump placed on a machining surface. The heater 21 is provided below the machining surface of the bonding stage 20, and is configured to be able to heat the workpiece 30 to a temperature suitable for bonding.

The operation part 40 is an input device including an input means such as a trackball, a mouse, a joystick, or a touch panel, and outputting operation content of an operator to the bonding controller 10. The display 41 displays an input screen for a first parameter relating to the wire w and a second parameter relating to the shape of the capillary 15. Examples of the first parameter include a material and a diameter Dw of the wire w, a diameter Df of the free air ball fab, and a diameter D3 and a thickness T3 of a crimp lower portion 63, which will be described later. Examples of the second parameter include a hole diameter Dh, a chamfer diameter Dc, and a chamfer angle Ac of the capillary 15, which will be described later. Based on the input screen displayed on the display 41, the operator operates the operation part 40 and inputs the first parameter and the second parameter.

The camera 42 is configured to be able to photograph the workpiece 30 placed on the machining surface of the bonding stage 20 and the tip of the wire w. The display 41 may display an image captured by the camera 42 at a predetermined magnification allowing visual recognition by the operator. The operator may observe the workpiece 30 and the tip of the wire w displayed on the display 41 and set some of the first parameters.

The bonding controller 10 is a computer configured to be able to output various control signals controlling each part of the bump-forming device 1 including the capillary 15 based on a predetermined software program. Although illustration is omitted, the bonding controller 10 includes, for example, an acquisition part, a display control part, a storage part, a calculation part, and an output part. The acquisition part acquires the first parameter and the second parameter input to the operation part 40. The display control part causes the display 41 to display the input screen for the first parameter and the second parameter or the image captured by the camera 42. The storage part stores parameters other than the first parameter and the second parameter, such as ultrasonic output of the ultrasonic horn 16, a pressurizing force of the capillary 15 on the bond point, and a moving speed of the capillary 15. Based on the first parameter and the second parameter, the calculation part calculates, among trajectories of the capillary 15 from where the wire w is crimped to the bond point to where the wire w is cut, at least a trajectory in a delivery step of delivering the wire w. Based on the trajectory of the capillary 15 calculated by the calculation part, the output part outputs a control signal controlling the XY table 12 and the bonding head 13. Based on various parameters stored in the storage part, the output part outputs various control signals controlling each part of the bump-forming device 1.

Figure 2:
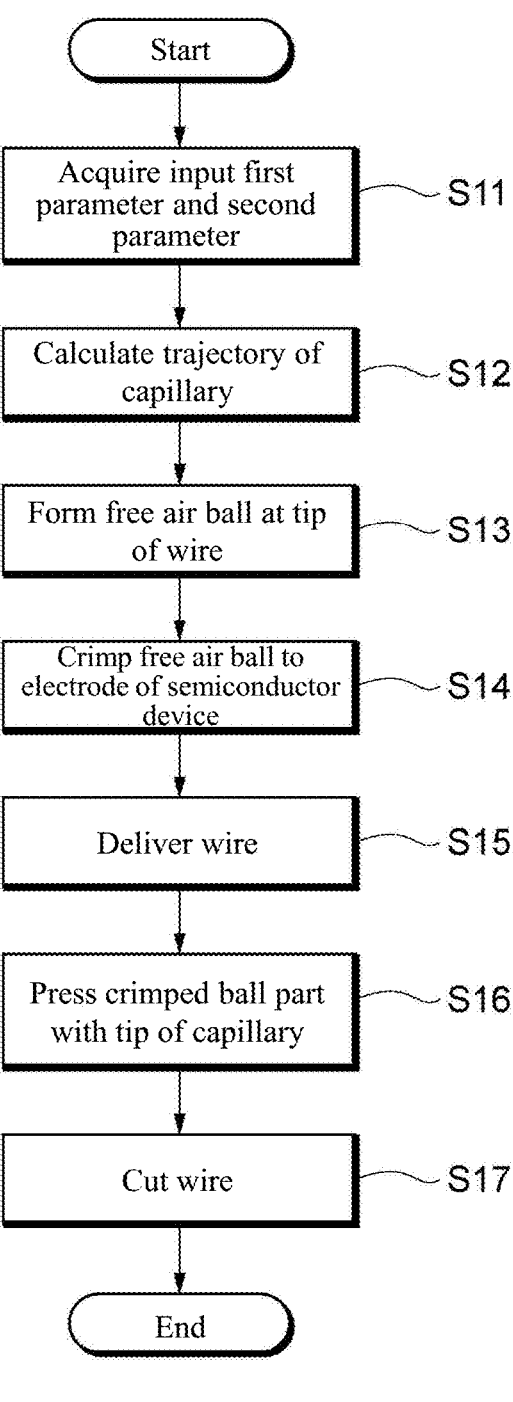
FIG. 2 is a flowchart schematically illustrating a bump-forming method according to one embodiment.
Figure 3:
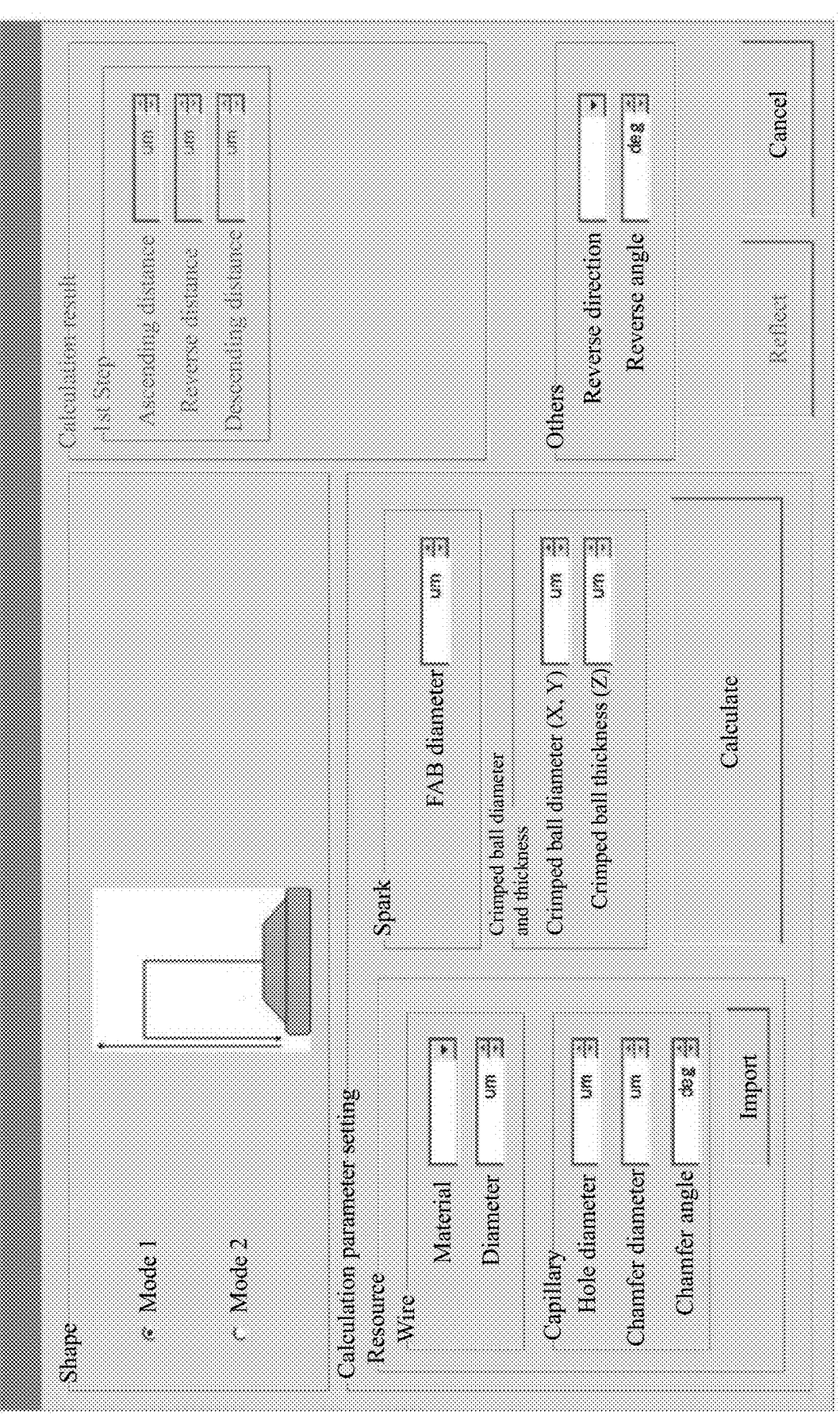
FIG. 3 illustrates an example of a parameter input screen.
Figure 4:
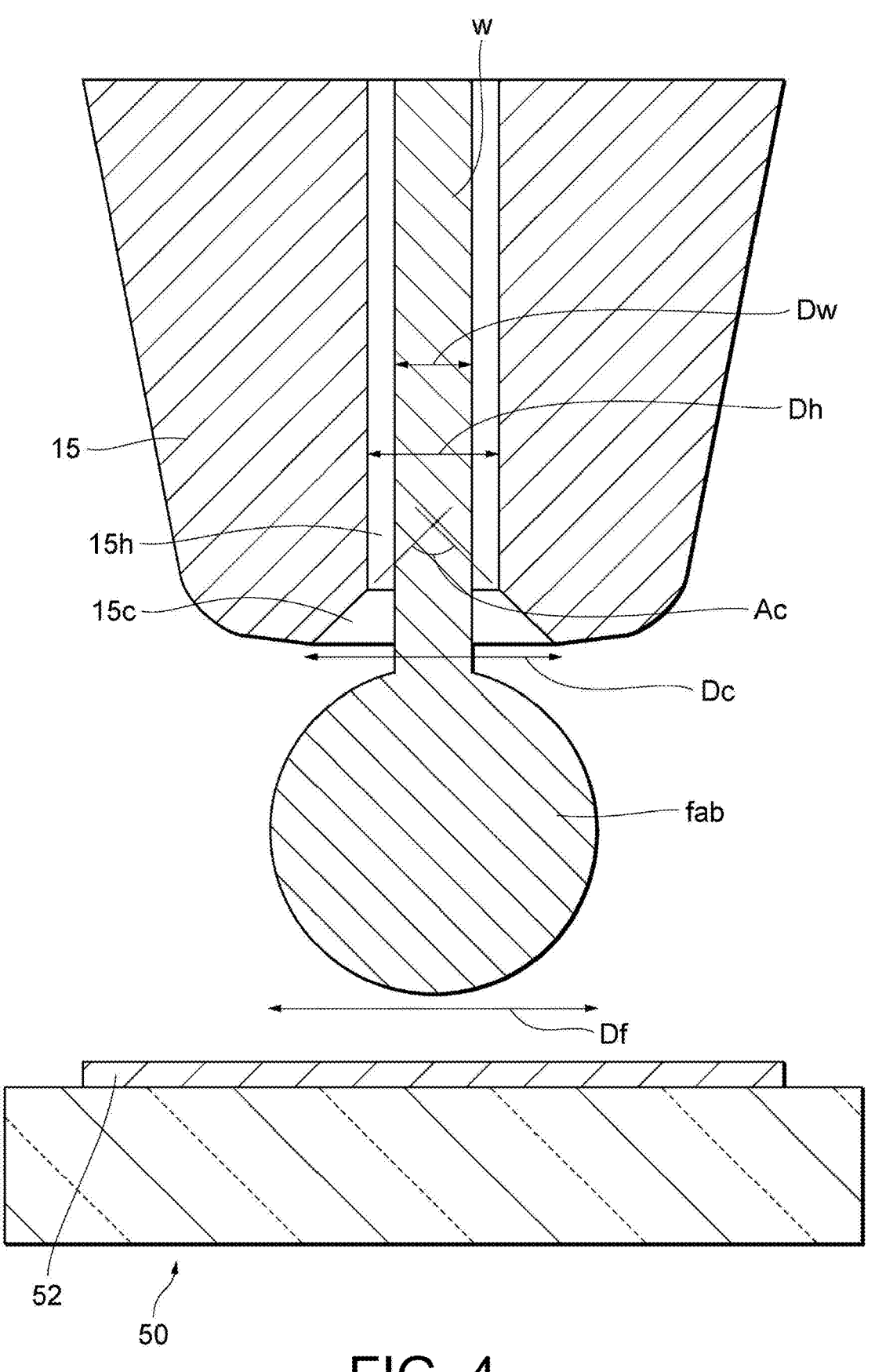
FIG. 4 is a sectional view schematically illustrating a state immediately before a wire is bonded to a bond point.
Figure 5:
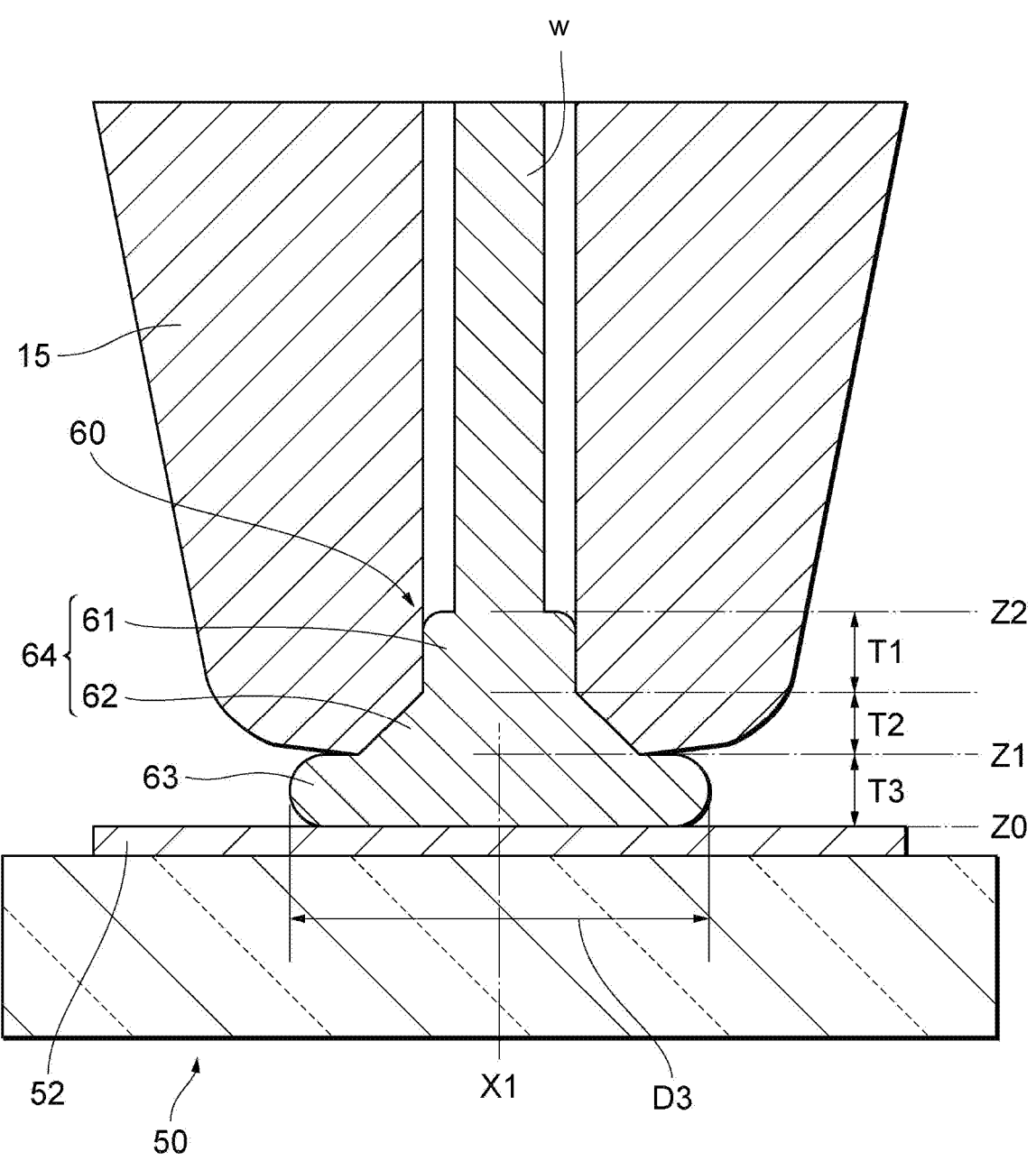
FIG. 5 is a sectional view schematically illustrating a state immediately after a wire is bonded to a bond point.

Next, a bump-forming method according to one embodiment of the present invention is described with reference to FIG. 2 to FIG. 5. The bump-forming device 1 described above is used in the bump-forming method. FIG. 2 is a flowchart schematically illustrating a bump-forming method according to one embodiment. FIG. 3 illustrates an example of a parameter input screen. FIG. 4 is a sectional view schematically illustrating a state immediately before a wire is bonded to a bond point. FIG. 5 is a sectional view schematically illustrating a state immediately after a wire is bonded to a bond point.

First, the first parameter and the second parameter input in the bump-forming method according to the present embodiment are described with reference to FIG. 4 and FIG. 5. FIG. 4 and FIG. 5 are sectional views illustrating a step of crimping the wire w to an electrode 52 corresponding to a bond point of a semiconductor device 50. A hole 15$h$ and a chamfer 15$c$ are formed in the capillary 15. The hole 15$h$ and the chamfer 15$c$ are through holes penetrating the capillary 15 in the Z direction, and the chamfer 15$c$ is formed on the tip side of the hole 15$h$. The hole 15$h$ and the chamfer 15$c$ are connected, and the chamfer 15$c$ opens at the tip of the capillary 15. The wire w is inserted through the hole 15$h$ and the chamfer 15$c$. A diameter (hereinafter referred to as "hole diameter Dh") of the hole 15$h$ is substantially constant at the tip of the capillary 15 and is greater than a diameter (hereinafter referred to as "wire diameter Dw") of the wire w. An angle formed by mutually facing inner peripheral surfaces of the chamfer 15$c$ corresponds to the chamfer angle Ac. A diameter of an opening formed by the chamfer 15$c$ at the tip of the capillary 15 corresponds to the chamfer diameter Dc. The chamfer diameter Dc is greater than the hole diameter Dh.

As illustrated in FIG. 4, immediately before the wire w is crimped to the electrode 52, the free air ball fab is formed by the spark at the tip of the wire w extending from the tip of the capillary 15. A diameter (hereinafter referred to as "free air ball diameter Df") of the free air ball fab is greater than the wire diameter Dw and greater than the chamfer diameter Dc. As illustrated in FIG. 5, the free air ball fab is crimped to the electrode 52, thereby being deformed into a crimped ball part 60. The crimped ball part 60 includes the crimp lower portion 63 formed between the capillary 15 and the electrode 52 and a crimp upper portion 64 formed inside the capillary 15. The crimp upper portion 64 includes a chamfer portion 62 formed inside the chamfer 15$c$ and a hole portion 61 formed inside the hole 15$h$. Since the volume of the crimped ball part 60 is equivalent to the volume of the free air ball fab, the volume of the free air ball fab is the sum of the volume of the crimp lower portion 63 and the volume of the crimp upper portion 64. The volume of the crimp upper portion 64 is the sum of the volume of the chamfer portion 62 and the volume of the hole portion 61. A diameter of the crimp lower portion 63 is set as the diameter D3, a thickness of the crimp lower portion 63 is set as the thickness T3, a thickness of the chamfer portion 62 is set as a thickness T2, and a thickness of the hole portion 61 is set as a thickness T1.

Next, the bump-forming method is described with reference to FIG. 2. Steps S11 to S17 illustrated in FIG. 2 are executed by a bump-forming program installed in the bonding controller 10. The bonding controller 10 is an example of a computer-readable recording medium recording the bump-forming program according to one embodiment of the present invention.

First, the inputted first parameter and second parameter are acquired (S11). At this time, the first parameter and the second parameter are inputted by, for example, the operator operating the operation part 40 while referring to the input screen illustrated in FIG. 3. The acquisition part of the bonding controller 10 acquires the input first parameter and second parameter.

In an example of the input screen illustrated in FIG. 3, as an input field for the first parameter, there are prepared a "Material" field and a "Diameter" field in a "Wire" field, a "FAB diameter" field in a "Spark" field, a "Crimped ball diameter (X, Y)" field and a "Crimped ball thickness (Z)" field in a "Crimped ball diameter and thickness" field. The material of the wire w is entered in the "Material" field in the "Wire" field. The wire diameter Dw is entered in the "Diameter" field in the "Wire" field. The free air ball diameter Df is entered in the "FAB diameter" field in the "Spark" field. The diameter D3 of the crimp lower portion 63 is entered in the "Crimped ball diameter (X, Y)" field in the "Crimped ball diameter and thickness" field, and the thickness T3 of the crimp lower portion 63 is entered in the "Crimped ball thickness (Z)" field in the "Crimped ball diameter and thickness" field. The free air ball diameter Df as well as the diameter D3 and the thickness T3 of the crimp lower portion 63 are measured values obtained by measuring the free air ball fab and the crimp lower portion 63 formed during trial production.

Furthermore, as an input field for the second parameter, there are prepared fields of "Hole diameter", "Chamfer diameter" and "Chamfer angle" in a "Capillary" field. The hole diameter Dh is entered in the "Hole diameter" field, the chamfer diameter Dc is entered in the "Chamfer diameter" field, and the chamfer angle Ac is entered in the "Chamfer angle" field.

Various parameters other than the first parameter and the second parameter have been stored in the storage part of the bonding controller 10 before step S11, and input of the various parameters by the operator is omitted in step S11. The various parameters stored in the storage part are used to determine the control signals controlling the torch electrode 14, the ultrasonic horn 16, the wire clamper 17, the wire tensioner 18, the rotary spool 19, the bonding stage 20, the heater 21, and the like.

Next, a trajectory of the capillary 15 is calculated (S12). At this time, the calculation part of the bonding controller 10 calculates the trajectory of the capillary 15 based on the first parameter and the second parameter acquired by the acquisition part. The calculated trajectory of the capillary 15 is a trajectory in the delivery step in which the capillary 15 is moved while the wire w is delivered in a step from crimping to cutting of the wire w. The calculated trajectory of the capillary 15 is, for example, a trajectory of an intersection point (X, Y, Z) between a center axis of the hole 15h and the chamfer 15c extending in the Z direction and an XY plane including the tip of the capillary 15. A starting point of the trajectory of the capillary 15 is, for example, a location (X,Z)=(X1, Z1) illustrated in FIG. 5. X1 is a position on the X coordinate of a center axis of the crimped ball part 60 extending in the Z direction, and Z1 is a position on the Z coordinate of a boundary surface between the crimp lower portion 63 and the crimp upper portion 64 extending on the XY plane.

Next, the free air ball fab is formed at the tip of the wire w (S13). At this time, the output part of the bonding controller 10 generates a spark between the tip of the wire w and the torch electrode 14 under the same conditions as when the operator measures the first parameter.

Next, the free air ball fab is crimped to the electrode 52 of the semiconductor device 50 (S14). At this time, the output part of the bonding controller 10 crimps the free air ball fab to the electrode 52 by the tip of the capillary 15 under the same conditions as when the operator measures the first parameter. As illustrated in FIG. 5, the free air ball fab is deformed and formed into the crimped ball part 60 including the crimp lower portion 63 and the crimp upper portion 64. Step S14 corresponds to an example of a "crimping step" according to the present invention.

Next, the wire w is delivered (S15). At this time, the output part of the bonding controller 10 moves the capillary 15 based on the trajectory of the capillary 15 calculated by the calculation part. When the capillary 15 is moved, the wire clamper 17 is released and the wire w is delivered. The calculated trajectory of the capillary 15 includes at least an ascending path away from the electrode 52, a slide path next to the ascending path that moves in a direction intersecting the ascending path, and a descending path next to the slide path that approaches the electrode 52.

Next, the crimped ball part 60 is pressed with the tip of the capillary 15 (S16). At this time, a position or depth of pressing is calculated by the calculation part of the bonding controller 10. In step S16, a shape of a bump is determined. That is, a height of the bump or a direction or angle of inclination of a bump surface is determined.

Next, the wire w is cut (S17). At this time, the capillary 15 is lifted (away from the electrode 52) with the wire clamper 17 in a holding state, and the wire w is cut at a bending point of the wire w. The bending point of the wire w is, for example, formed in step S16.

As described above, according to the bump-forming device 1 according to one embodiment of the present invention, by inputting the first parameter and the second parameter for calculating the control signal for the XY table 12 and the bonding head 13 that determine the trajectory of the capillary 15, a bump of a desired shape can be formed without inputting any other parameters. That is, trial production work and measurement work for setting a wide variety of parameters, which are not easy even for a skilled worker, can be simplified.

Figure 6:
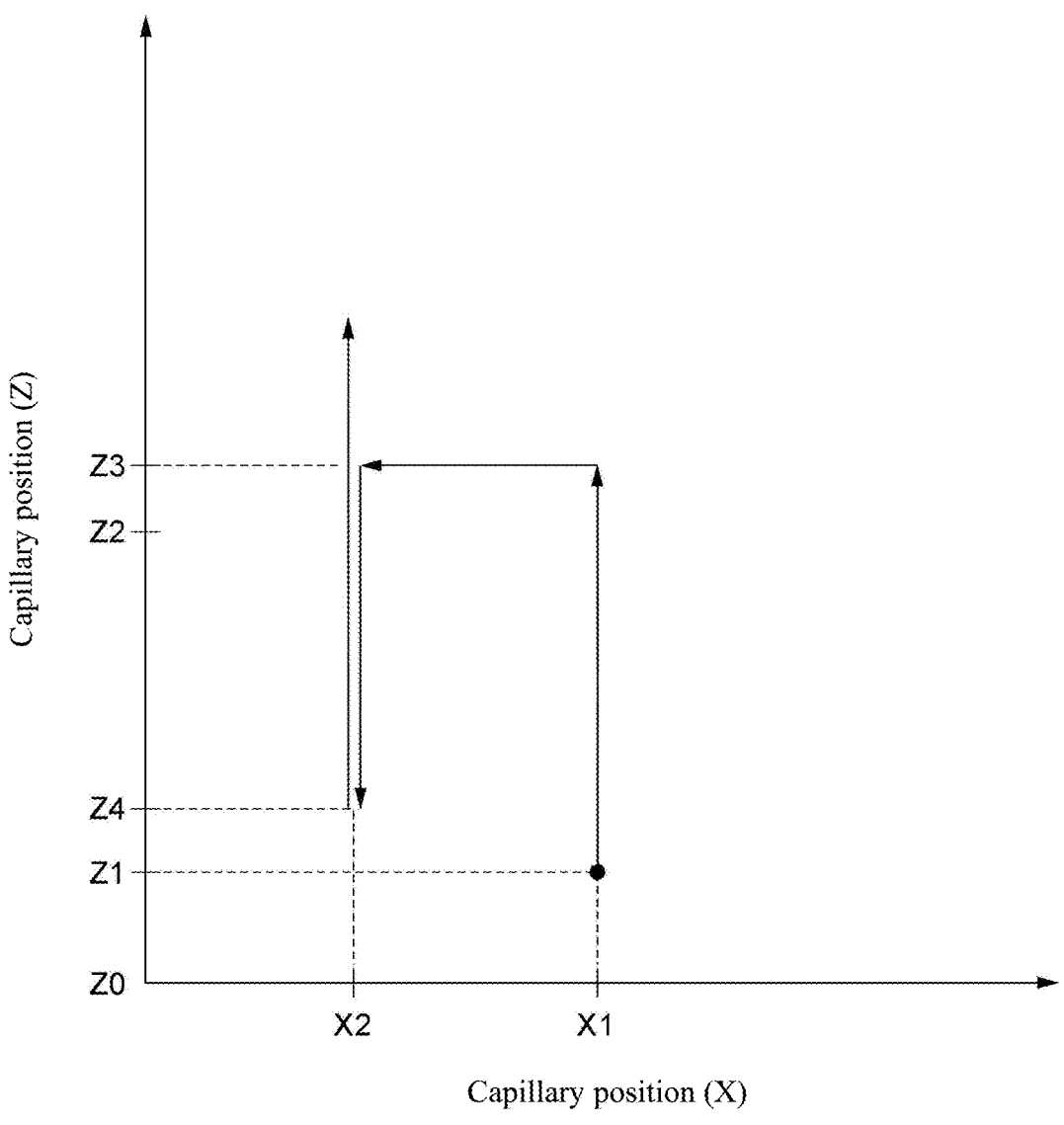
FIG. 6 illustrates an example of a trajectory of a capillary according to a first embodiment.
Figure 7:
FIG. 7 is a photograph illustrating a bump formed according to the first embodiment.

Next, a bump-forming method according to a first embodiment is described with reference to FIG. 6 and FIG. 7. FIG. 6 illustrates an example of a trajectory of a capillary according to the first embodiment. FIG. 7 is a photograph illustrating a bump formed according to the first embodiment.

The first embodiment is a bump-forming method for forming a bump of a first shape. As illustrated in FIG. 6, the trajectory of the capillary 15 calculated by the calculation part of the bonding controller 10 in the present embodiment includes the ascending path, the slide path, and the descending path.

The ascending path is a path along the Z direction of the capillary 15 moving away from the electrode 52 with (X,Z)=(X1, Z1) as a starting point. In the ascending path, the capillary 15 moves from (X,Z)=(X1, Z1) to (X,Z)=(X1, Z3). A movement direction of the capillary 15 in the ascending path is set as a +Z direction. At this time, a distance of the ascending path is calculated by the following equation based on the thickness T1 of the hole portion 61 and the thickness T2 of the chamfer portion 62.

$$Z3-Z1=T2+T1+\alpha1$$

α1 is, for example, a constant obtained empirically, but may also be a variable determined based on the material or the wire diameter Dw of the wire w.

The thickness T2 is calculated by the following equation based on the hole diameter Dh, the chamfer diameter Dc and the chamfer angle Ac.

$$T2=\{(Dc-Dw)/2\}/\{\tan(Ac/2)\}$$

When the volume of the hole portion 61 is set as V1, the thickness T1 of the hole portion 61 is calculated by the following equation.

$$T1=V1/\{(Dh/2)^2 \times \pi\}$$

When the volume of the free air ball fab is set as V0, the volume of the chamfer portion 62 is set as V2, and the volume of the crimp lower portion 63 is set as V3, the volume V1 of the hole portion 61 is calculated by the following equation.

$$V1=V0-(V2+V3)$$

Based on the free air ball diameter Df, the hole diameter Dh, the chamfer diameter Dc, the thickness T2 of the chamfer portion 62, and the diameter D3 and the thickness T3 of the crimp lower portion 63, the volume V0 of the free air ball fab, the volume V2 of the chamfer portion 62, and the volume V3 of the crimp lower portion 63 are calculated by the following equations.

$$V0=\{4 \times \pi \times (Df/2)^3\}/3$$

$$V2=(\pi/3) \times (Dh^2+Dh \times Dc+Dc^2) \times T2$$

$$V3=\pi \times (D3/2)^2 \times T3$$

Next, the slide path is a path along the X direction with (X,Z)=(X1, Z3) (end point of the ascending path) as a starting point and (X,Z)=(X2, Z3) as an end point. The movement direction of the capillary 15 in the slide path is set as a −X direction. At this time, a distance X2−X1 of the slide path is calculated by the following equation based on the chamfer diameter Dc and the wire diameter Dw.

$$X2-X1=-\{(Dc/Dw) \times \beta1+\beta2\} \times Dw$$

β1 and β2 are, for example, constants obtained empirically based on the material of the wire w, but may also be variables determined based on the material or the wire diameter Dw of the wire w.

Next, the descending path is a path along the Z direction with (X,Z)=(X2, Z3) (end point of the slide path) as a starting point and (X,Z)=(X2, Z4) as an end point. The movement direction of the capillary 15 in the descending path is set as a −Z direction. At this time, a distance Z4−Z3 of the descending path is calculated by the following equation based on the distance Z3−Z1 of the ascending path.

$$Z4-Z3=-\{(Z3-Z1)+\gamma1\}$$

γ1 is, for example, a constant obtained empirically based on the material of the wire w, but may also be a variable determined based on the material or the wire diameter Dw of the wire w.

At (X,Z)=(X2, Z4) being the end point of the descending path, the crimped ball part 60 is pressed and deformed. Accordingly, as illustrated in FIG. 7, the surface of the bump becomes an inclined surface inclined in the +Z direction from the −X direction side toward a +X direction side.

The ascending path may also be inclined in the X direction or the Y direction. At this time, the distance of the ascending path is appropriately adjusted based on an inclination angle of the ascending path with respect to the Z direction. Similarly, the slide path may be inclined in the Y direction or the Z direction, and the descending path may be inclined in the X direction or the Y direction.

Figure 8:
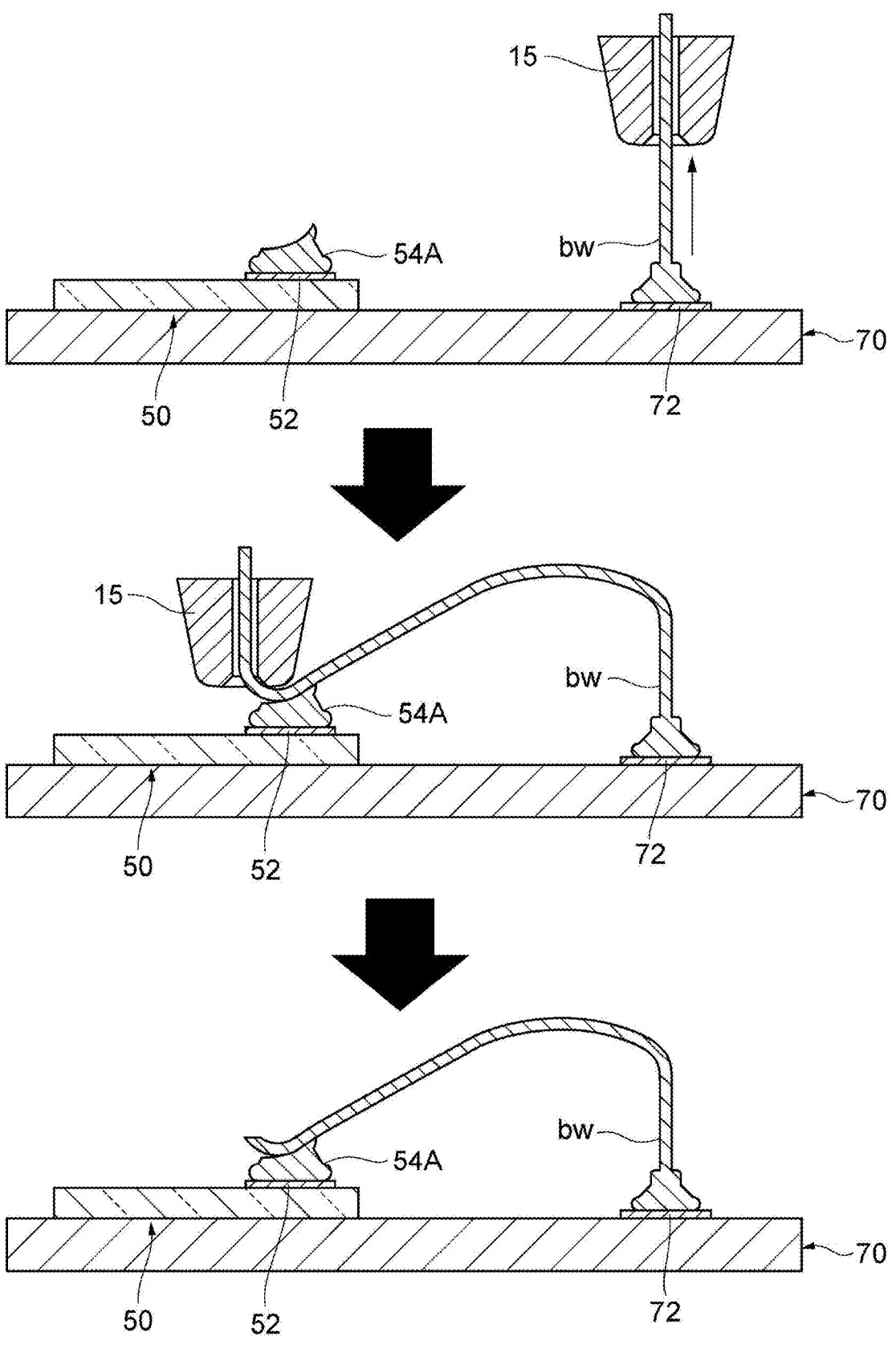
FIG. 8 illustrates a first use example of the bump formed according to the first embodiment.
Figure 9:
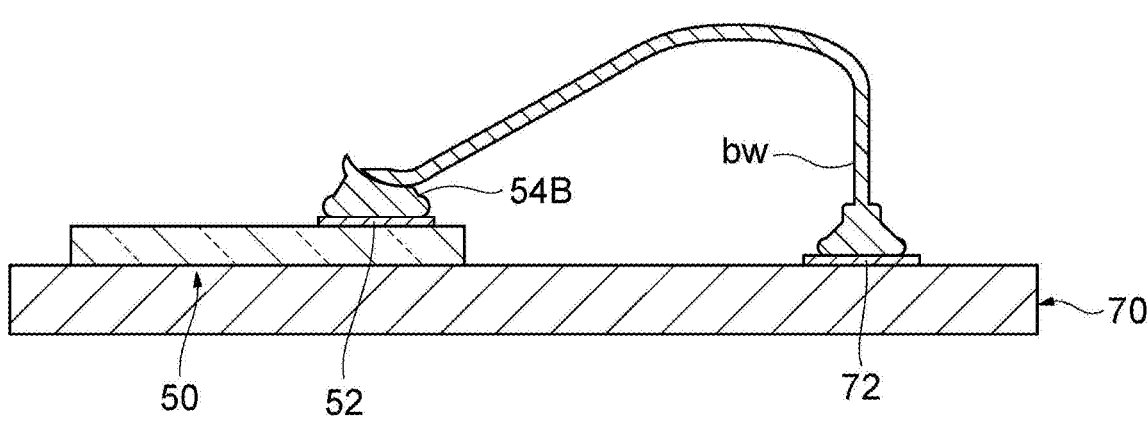
FIG. 9 illustrates a second use example of the bump formed according to the first embodiment.
Figure 10:
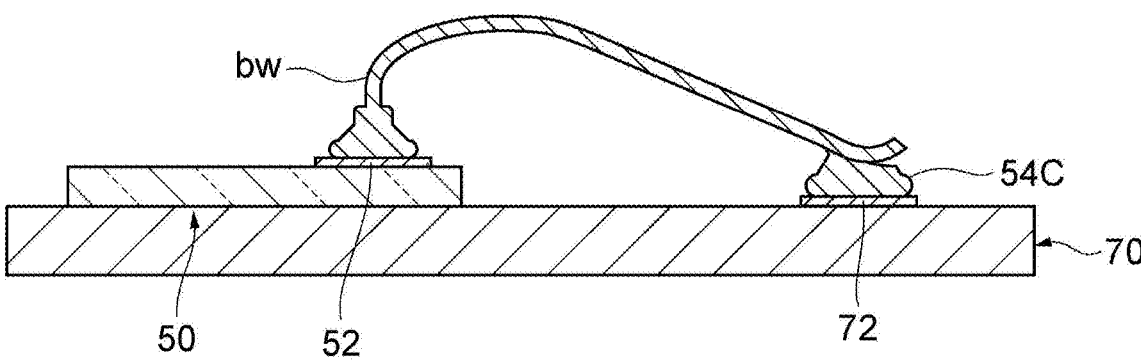
FIG. 10 illustrates a third use example of the bump formed according to the first embodiment.
Figure 11:
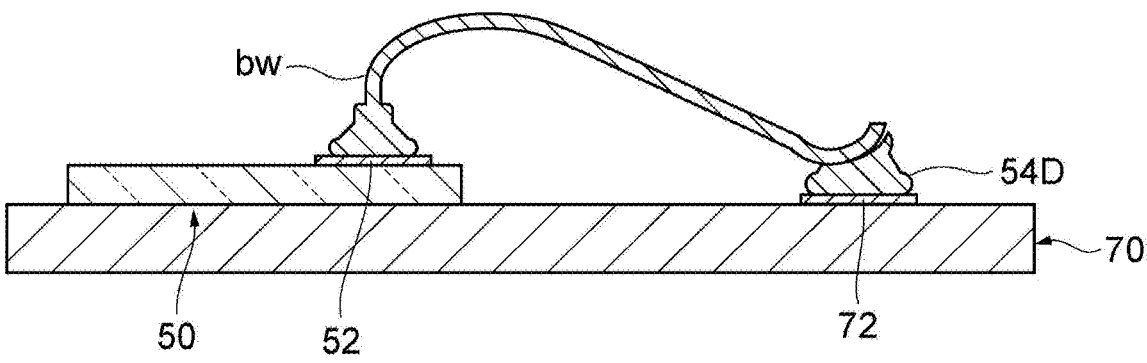
FIG. 11 illustrates a fourth use example of the bump formed according to the first embodiment.
Figure 12:
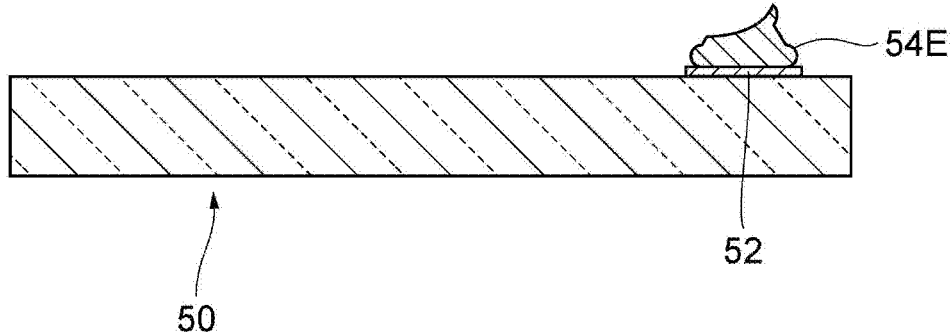
FIG. 12 illustrates a fifth use example of the bump formed according to the first embodiment.
Figure 13:
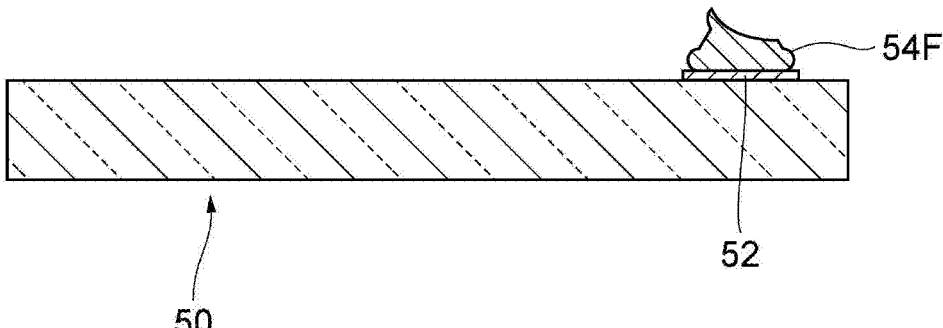
FIG. 13 illustrates a sixth use example of the bump formed according to the first embodiment.

Next, use examples of the bump according to the first embodiment are described with reference to FIG. 8 to FIG. 13. FIG. 8 illustrates a first use example of the bump formed according to the first embodiment. FIG. 9 illustrates a second use example of the bump formed according to the first embodiment. FIG. 10 illustrates a third use example of the bump formed according to the first embodiment. FIG. 11 illustrates a fourth use example of the bump formed according to the first embodiment. FIG. 12 illustrates a fifth use example of the bump formed according to the first embodiment. FIG. 13 illustrates a sixth use example of the bump formed according to the first embodiment.

As illustrated in FIG. 8, a bump 54A formed according to the first embodiment can be formed at one bond point of a pair of bond points electrically connected by wire bonding. The electrode 52 of the semiconductor device 50 corresponds to an example of a "first bond point" according to the present invention, and an electrode 72 of a substrate 70 corresponds to an example of a "second bond point" according to the present invention. The bump 54A is formed on the electrode 52 of the semiconductor device 50. Since the bump 54A is formed on the electrode 52 of the semiconductor device 50, bonding strength between the electrode 52 of the semiconductor device 50 and a bonding wire bw is improved. Accordingly, since sufficient bonding strength can be obtained without increasing a force for pressing the bonding wire bw against the electrode 52 of the semiconductor device 50, damage to the semiconductor device 50 caused by a wire bonding apparatus can be reduced.

The bump 54A is formed so as to have a smaller thickness on a side far from the electrode 72 of the substrate 70 than on a side close to the electrode 72 of the substrate 70. In other words, a surface of the bump 54A formed on the electrode 52 (one bond point of a pair of bond points) of the semiconductor device 50 is inclined away from the semiconductor device 50 as approaching the electrode 72 (the other bond point of the pair of bond points) of the substrate 70. In a mode of wire bonding illustrated in FIG. 8, first, the bonding wire bw is bonded to the electrode 72 of the substrate 70. Next, the capillary 15 is moved while the bonding wire bw is delivered. Finally, the bonding wire bw is bonded to the bump 54A and then cut. That is, the wire bonding illustrated in FIG. 8 is so-called forward bonding in which the electrode 72 of the substrate 70 is a primary bond point and the electrode 52 of the semiconductor device 50 is a secondary bond point. At this time, the bonding wire bw bonded to the bump 54A is away from an outer edge of the semiconductor device 50 due to the inclination of the surface of the bump 54A. Accordingly, even if the bonding wire bw extends substantially parallel to a surface of the semiconductor device 50 or the substrate 70, the inclination of the surface of the bump 54A prevents the bonding wire bw from falling down. According to this, contact between the semiconductor device 50 and the bonding wire bw can be suppressed.

In the second use example illustrated in FIG. 9, a bump 54B is used for wire bonding of forward bonding as in the first use example. In FIG. 9, the bump 54B formed on the electrode 52 of the semiconductor device 50 is formed so as to have a greater thickness on the side far from the electrode 72 of the substrate 70 than on the side close to the electrode 72 of the substrate 70. According to this, tail cut of the bonding wire bw is facilitated, and bending of the bonding wire bw can be reduced.

In the third use example illustrated in FIG. 10, a bump 54C is used for wire bonding of so-called reverse bonding in which the electrode 52 of the semiconductor device 50 is the primary bond point and the electrode 72 of the substrate 70 electrode 72 is the secondary bond point. In FIG. 10, the bump 54C formed on the electrode 72 of the semiconductor device 70 is formed so as to have a smaller thickness on a side far from the electrode 52 of the semiconductor device 50 than on a side close to the electrode 52 of the substrate 50. According to this, like the first use example, the bonding wire bw can be prevented from falling down, and contact between the semiconductor device 50 and the bonding wire bw can be suppressed.

In the fourth use example illustrated in FIG. 11, a bump 54D is used for wire bonding of reverse bonding as in the third use example. In FIG. 11, the bump 54D formed on the electrode 72 of the semiconductor device 70 is formed so as to have a greater thickness on the side far from the electrode 52 of the semiconductor device 50 than on the side close to the electrode 52 of the substrate 50. According to this, like the second use example, tail cut of the bonding wire bw is facilitated, and bending of the bonding wire bw can be reduced.

In the first to fourth use examples, the bump according to the first embodiment is formed on the secondary bond point. However, the bump may also be formed on the primary bond point. The bump may be formed at only one bond point or at both bond points of the pair of bond points electrically connected by wire bonding.

In the fifth use example illustrated in FIG. 12, a bump 54E is formed on the electrode 52 of the semiconductor device 50. The bump 54E is formed so as to have a smaller thickness on a side far from the outer edge of the semiconductor device 50 than on a side close to the outer edge of the semiconductor device 50 when the electrode 52 is viewed in a plan view. In the sixth use example illustrated in FIG. 13, a bump 54F is formed on the electrode 52 of the semiconductor device 50. The bump 54F is formed so as to have a greater thickness on the side far from the outer edge of the semiconductor device 50 than on the side close to the outer edge of the semiconductor device 50 when the electrode 52 is viewed in a plan view. The bumps 54E and 54F are used for, for example, flip-chip mounting. Which of the bump 54E and the bump 54F is to be formed is appropriately selected according to the position, shape or the like of an object to be bonded. The bump 54E and the bump 54F may be used in applications other than flip-chip mounting.

The shape of the bump used for flip-chip mounting is not limited to that of the bump 54E or the bump 54F. For example, in the case of forming the bump on each of two adjacent electrodes, the two bumps may be formed so as to have a smaller thickness on a side close to each other than on a side away from each other, or may be formed so as to have a greater thickness on the side close to each other than on the side away from each other. Similarly, in the applications other than flip-chip mounting, the shape of the bump used for flip-chip mounting is not limited to that of the bump 54E or the bump 54F.

Figure 14:
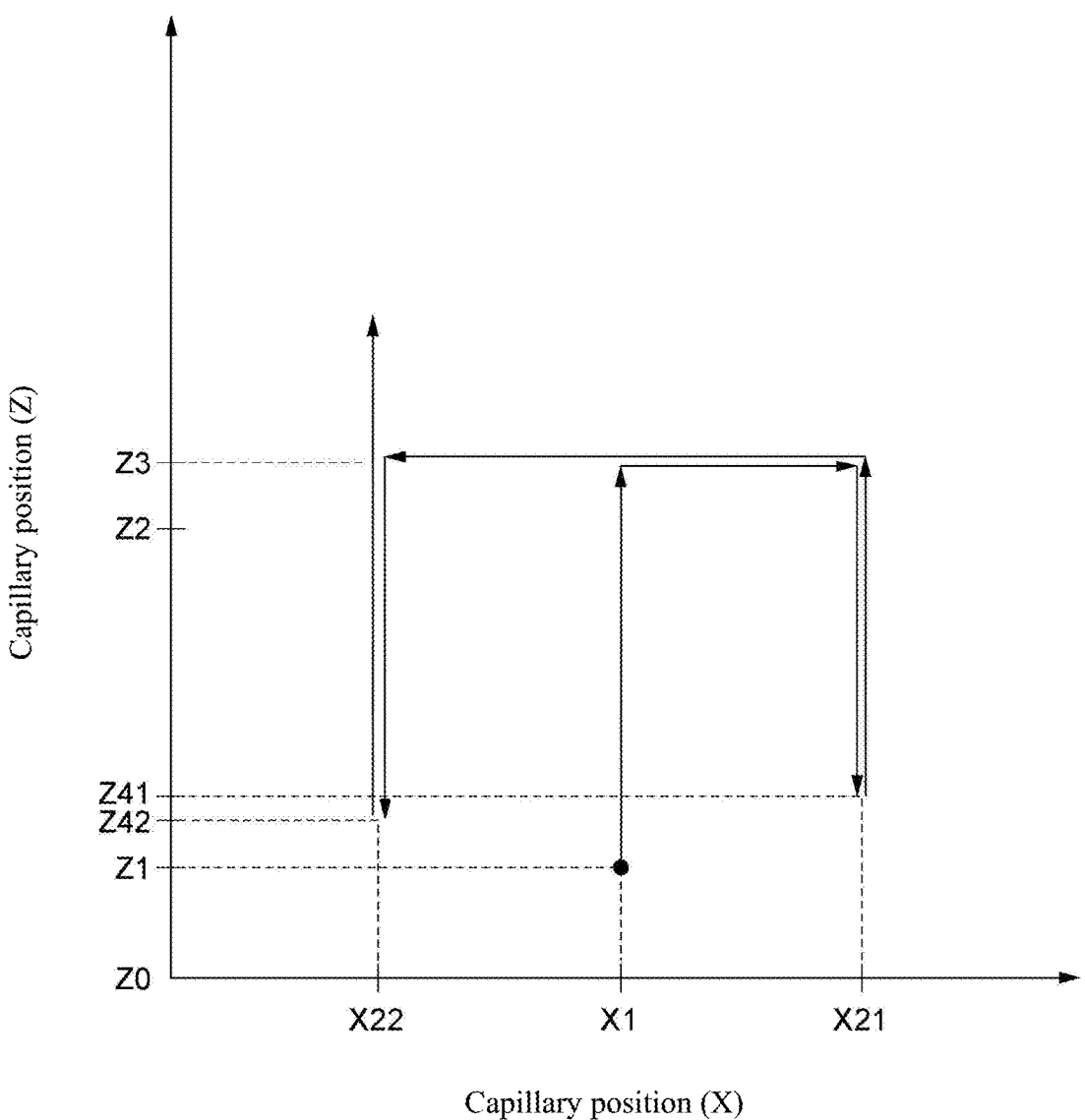
FIG. 14 illustrates an example of a trajectory of a capillary according to a second embodiment.
Figure 15:
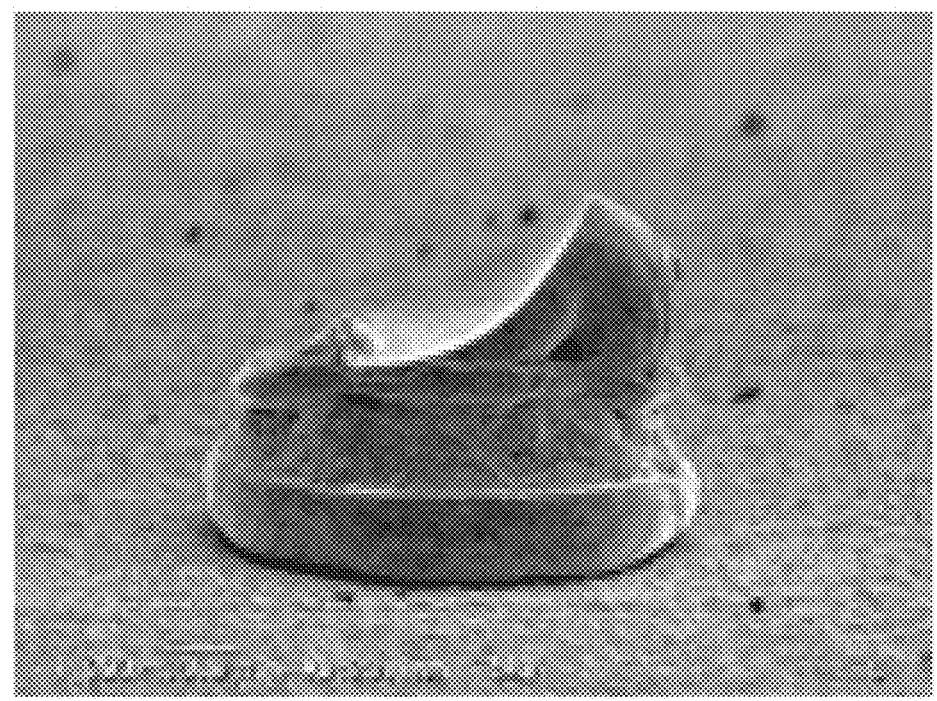
FIG. 15 is a photograph illustrating a bump formed according to the second embodiment.

Next, a bump-forming method according to a second embodiment is described with reference to FIG. 14 and FIG. 15. FIG. 14 illustrates an example of a trajectory of a capillary according to the second embodiment. FIG. 15 is a photograph illustrating a bump formed according to the second embodiment.

The second embodiment is a bump-forming method for forming a bump of a second shape. As illustrated in FIG. 14, the trajectory of the capillary 15 calculated by the calculation part of the bonding controller 10 in the present embodiment includes a first ascending path, a first slide path, a first descending path, a second ascending path, a second slide path, and a second descending path. The movement direction of the capillary 15 in the first ascending path and the second ascending path is set as the +Z direction, and the movement direction of the capillary 15 in the first descending path and the second descending path is set as the −Z direction. The movement direction of the capillary 15 in the first slide path is set as the +X direction, and the movement direction of the capillary 15 in the second slide path is set as the −X direction.

A distance of the first ascending path is the same as the distance of the ascending path in the first embodiment.

The first slide path is a path along the X direction with (X,Z)=(X1, Z3) (end point of the first ascending path) as a starting point and (X,Z)=(X21, Z3) as an end point. A distance X21−X1 of the first slide path is calculated by the following equation based on the chamfer diameter Dc and the wire diameter Dw.

$$X21{-}X1{=}\{(Dc/Dw){\times}\beta11{+}\beta12\}{\times}Dw$$

$\beta11$ and $\beta12$ are, for example, constants obtained empirically based on the material of the wire w, but may also be variables determined based on the material or the wire diameter Dw of the wire w.

The first descending path is a path along the Z direction with (X,Z)=(X21, Z3) (end point of the first slide path) as a starting point and (X,Z)=(X21, Z41) as an end point. A distance Z41−Z3 of the first descending path is calculated by the following equation based on the distance Z3−Z1 of the first ascending path.

$$Z41{-}Z3{=}{-}\{(Z3{-}Z1){+}\gamma11\}$$

$\gamma11$ is, for example, a constant obtained empirically based on the material of the wire w, but may also be a variable determined based on the material or the wire diameter Dw of the wire w.

The second descending path is a path along the Z direction with (X,Z)=(X21, Z41) (end point of the first descending path) as a starting point and (X,Z)=(X21, Z3) as an end point. A distance of the second descending path is, for example, substantially equivalent to the distance of the first ascending path.

The second slide path is a path along the X direction with (X,Z)=(X21, Z3) (end point of the second ascending path) as a starting point and (X,Z)=(X22, Z3) as an end point. A distance X22−X21 of the second slide path is calculated by the following equation based on the distance X21−X1 of the first slide path.

$$X22{-}X21{=}{-}(X21{-}X1){\times}2$$

The second descending path is a path along the Z direction with (X,Z)=(X22, Z3) (end point of the second slide path) as a starting point and (X,Z)=(X22, Z42) as an end point. A distance Z42−Z3 of the second descending path is calculated by the following equation based on the distance Z3−Z1 of the first ascending path.

$$Z42-Z3=-\{(Z3-Z1)+\gamma21\}$$

γ21 is, for example, a constant obtained empirically based on the material of the wire w, but may also be a variable determined based on the material or the wire diameter Dw of the wire w. γ21=γ11 may be satisfied, and at this time, Z42=Z41.

By entering "180 deg" in a "Reverse angle" field in FIG. 3, a slide path can be reversed as illustrated in FIG. 15. In this case, a bump is formed so as to have a smaller thickness on the side far from the electrode 72 as the bonding target on the side close to the electrode 72.

As illustrated in FIG. 15, according to the second embodiment, a bump having a taller back than that of the first embodiment can be formed.

As described above, according to one aspect of the present invention, a bump-forming device, a bump-forming method, and a bump-forming program can be provided in which parameter setting is simplified.

The embodiments described above are for facilitating the understanding of the present invention rather than for limiting the interpretation of the present invention. Each element included in the embodiments and its arrangement, material, condition, shape, size, and the like are not limited to those illustrated and can be appropriately changed. It is possible to partially replace or combine the configurations shown in different embodiments.

The invention claimed is:

1. A bump-forming device comprising:
a bonding tool bonding a wire to a bond point as a bonding target; and
a bonding controller controlling the bonding tool to form a bump on the bond point,
wherein
the bonding controller is configured to execute:
a crimping step in which a ball part formed at a tip of the wire extending from a tip of the bonding tool is crimped to the bond point by the tip of the bonding tool;
a delivery step in which the bonding tool is moved while the wire is delivered from the ball part crimped to the bond point;
a pressing step in which a portion of the ball part crimped to the bond point is pressed by the tip of the bonding tool, and the ball part crimped to the bond point is deformed; and
a cutting step in which the wire is cut and the bump is formed on the bond point;
based on a first parameter relating to the wire and a second parameter relating to shape of the bonding tool, at least a trajectory in the delivery step in the trajectory of the bonding tool is determined;
wherein the first parameter comprises a diameter of the ball part before being crimped and a diameter and a thickness of a crimp lower portion of the ball part crimped to the bond point, the crimp lower portion being formed between the bonding tool and the bond point; and
wherein the second parameter comprises a hole diameter of a hole of the bonding tool through which the wire is inserted, and a chamfer diameter and a chamfer angle of a chamfer provided on a tip side of the hole of the bonding tool.

2. The bump-forming device according to claim 1, wherein the bonding controller acquires the first parameter input by an input device and the second parameter input by the input device, and calculates the trajectory of the bonding tool.

3. The bump-forming device according to claim 2, wherein
the bonding controller calculates a volume of a crimp upper portion of the ball part crimped to the bond point, wherein the crimp upper portion being formed inside the bonding tool.

4. The bump-forming device according to claim 3, wherein
the trajectory of the bonding tool comprises an ascending path away from the bond point; and
the bonding controller calculates a distance of the ascending path based on the volume of the crimp upper portion.

5. The bump-forming device according to claim 4, wherein
the trajectory of the bonding tool further comprises a slide path moving in a direction intersecting the ascending path;
the first parameter comprises a diameter and a material of the wire; and
the bonding controller calculates a distance of the slide path based on the chamfer diameter and the diameter and the material of the wire.

6. The bump-forming device according to claim 5, wherein
the trajectory of the bonding tool further comprises a descending path approaching to the bond point; and
the bonding controller calculates a distance of the descending path based on the distance of the ascending path and the material of the wire.

7. A bump-forming method comprising:
a crimping step in which a ball part formed at a tip of a wire extending from a tip of a bonding tool is crimped to a bond point by the tip of the bonding tool;
a delivery step in which the bonding tool is moved while the wire is delivered from the ball part crimped to the bond point;
a pressing step in which a portion of the ball part crimped to the bond point is pressed by the tip of the bonding tool, and the ball part crimped to the bond point is deformed; and
a cutting step in which the wire is cut and a bump is formed on the bond point,
wherein
based on a first parameter relating to the wire and a second parameter relating to shape of the bonding tool, at least a trajectory in the delivery step in the trajectory of the bonding tool is determined;
wherein the first parameter comprises a diameter of the ball part before being crimped and a diameter and a thickness of a crimp lower portion of the ball part crimped to the bond point, the crimp lower portion being formed between the bonding tool and the bond point; and
wherein the second parameter comprises a hole diameter of a hole of the bonding tool through which the wire is inserted, and a chamfer diameter and a chamfer angle of a chamfer provided on a tip side of the hole of the bonding tool.

8. The bump-forming method according to claim 7, wherein,

between a first bond point and a second bond point electrically connected by a wire bonding, the bump is formed at the first bond point; and the bump has a greater thickness on a side close to the second bond point than on a side far from the second bond point.

9. A non-transitory computer-readable medium recording a bump-forming program that causes a computer to execute:

crimping processing in which a ball part formed at a tip of a wire extending from a tip of a bonding tool is crimped to a bond point by the tip of the bonding tool;

delivery processing in which the bonding tool is moved while the wire is delivered from the ball part crimped to the bond point;

pressing processing in which a portion of the ball part crimped to the bond point is pressed by the tip of the bonding tool, and the ball part crimped to the bond point is deformed; and

16 cutting processing in which the wire is cut and a bump is formed on the bond point, wherein based on a first parameter relating to the wire and a second parameter relating to shape of the bonding tool, at least a trajectory in the delivery processing in the trajectory of the bonding tool is determined;

wherein the first parameter comprises a diameter of the ball part before being crimped and a diameter and a thickness of a crimp lower portion of the ball part crimped to the bond point, the crimp lower portion being formed between the bonding tool and the bond point; and wherein the second parameter comprises a hole diameter of a hole of the bonding tool through which the wire is inserted, and a chamfer diameter and a chamfer angle of a chamfer provided on a tip side of the hole of the bonding tool.

* * * * *